United States Patent
Deimling

(10) Patent No.: US 7,443,162 B2
(45) Date of Patent: Oct. 28, 2008

(54) MAGNETIC RESONANCE IMAGING METHOD AND APPARATUS WITH APPLICATION OF THE TRUEFISP SEQUENCE AND SEQUENTIAL ACQUISITION OF THE MR IMAGES OF MULTIPLE SLICES OF A MEASUREMENT SUBJECT

(75) Inventor: Michael Deimling, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 124 days.

(21) Appl. No.: 11/501,864

(22) Filed: Aug. 8, 2006

(65) Prior Publication Data

US 2007/0035299 A1     Feb. 15, 2007

(30) Foreign Application Priority Data

Aug. 8, 2005     (DE)     ........................ 10 2005 037 369

(51) Int. Cl.
  *G01V 3/00*     (2006.01)
(52) U.S. Cl. ...................................... 324/307; 324/309
(58) Field of Classification Search ................. 324/307, 324/309
  See application file for complete search history.

(56) References Cited

U.S. PATENT DOCUMENTS

| | | | |
|---|---|---|---|
| 4,769,603 | A | 9/1988 | Oppelt et al. |
| 6,366,090 | B1 | 4/2002 | Heid |
| 6,404,195 | B1 | 6/2002 | Deimling |
| 6,888,349 | B2 | 5/2005 | Fautz |
| 2003/0122545 | A1 | 7/2003 | Van Den Brink et al. |

OTHER PUBLICATIONS

"Principles and Applications of Balanced SSFP Techniques," Scheffler et al, Eur. Radiol., vol. 13 (2003) pp. 2049-2418.

(Continued)

*Primary Examiner*—Brij B Shrivastav
*Assistant Examiner*—Megann E Vaughn
(74) *Attorney, Agent, or Firm*—Schiff Hardin LLP

(57) ABSTRACT

In a method and apparatus for generation of magnetic resonance (MR) images based on the TrueFISP sequence with simultaneous acquisition of the MR images of a number of parallel slices of a measurement subject the number of the slices N to be acquired in the measurement subject is established whereby N is at least, the number of the phase coding lines MA per raw data matrix and slice N are established, with the requirement that the quotient of MA and N is a natural number, the repetition time TR, the radio-frequency pulse duration RF and the flip angle α are established, of each raw data matrix is sub-divided into S separate segments to be measured, whereby S is equal to N or a whole-number multiple of N, with the requirement that the quotient Q of MA and S that corresponds to the number of the phase coding lines per segment is a natural number, data are acquired for all segments S of all slices N, whereby the time duration, in msec, $T_{Seg}$ for the acquisition of the data of each segment is $$T_{Seg} = TR + RF + \frac{MA}{S} \cdot TR,$$

and the measurement of all segments S of all slices N is implemented such that the time duration $T_{Relax}$ is $T_{Relax}=(N-1)\cdot T_{Seg}$ [msec] for the relaxation of the magnetization $M_Z$ with the relaxation constant $T_1$ in a slice N that corresponds to the time span from the end of the measurement of a first segment up to the beginning of the measurement of a second segment of the same slice.

12 Claims, 6 Drawing Sheets

OTHER PUBLICATIONS

"Analysis of Multiple-Acquisition SSFP," Bangerter et al, Magnetic Resonance in Medicine, vol. 51 (2004) pp. 1038-1047.

"FISP: Eine Neue Schnelle Puls-sequenz für die Kernspintomographie," Oppelt et al, electromedica, vol. 54, No. 1 (1986) pp. 15-18.

"Magnetization Prepared True FISP Imaging," Deimling et al, Society of Magnetic Resonance (1994) p. 495.

a) Grey brain matter
b) White brain matter

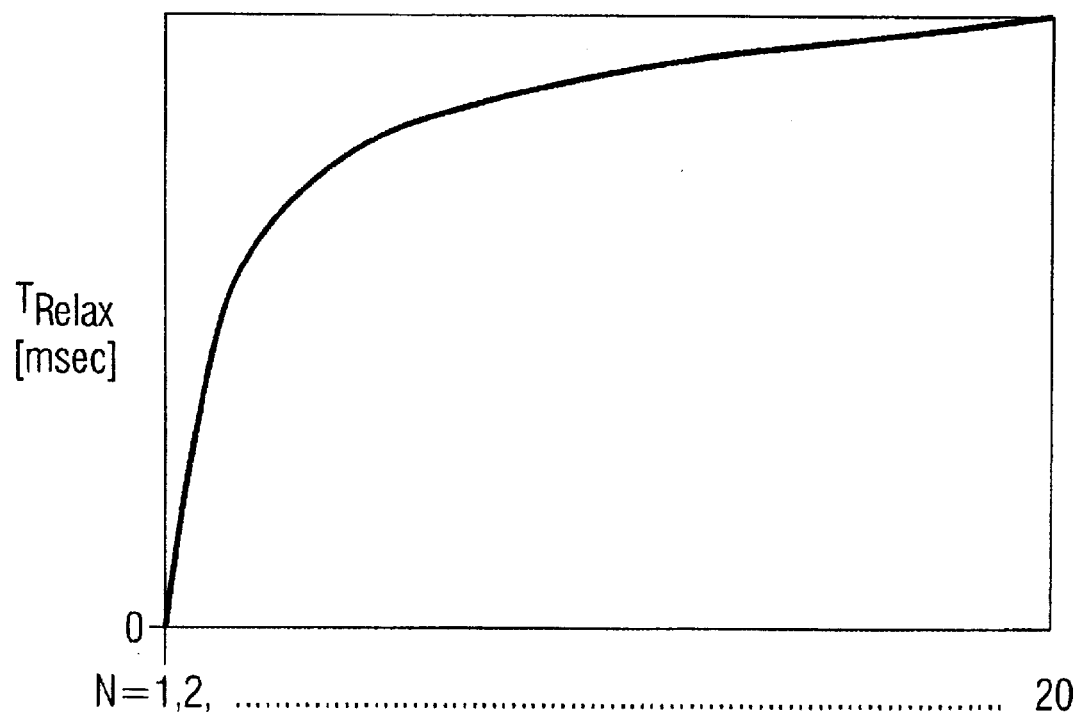

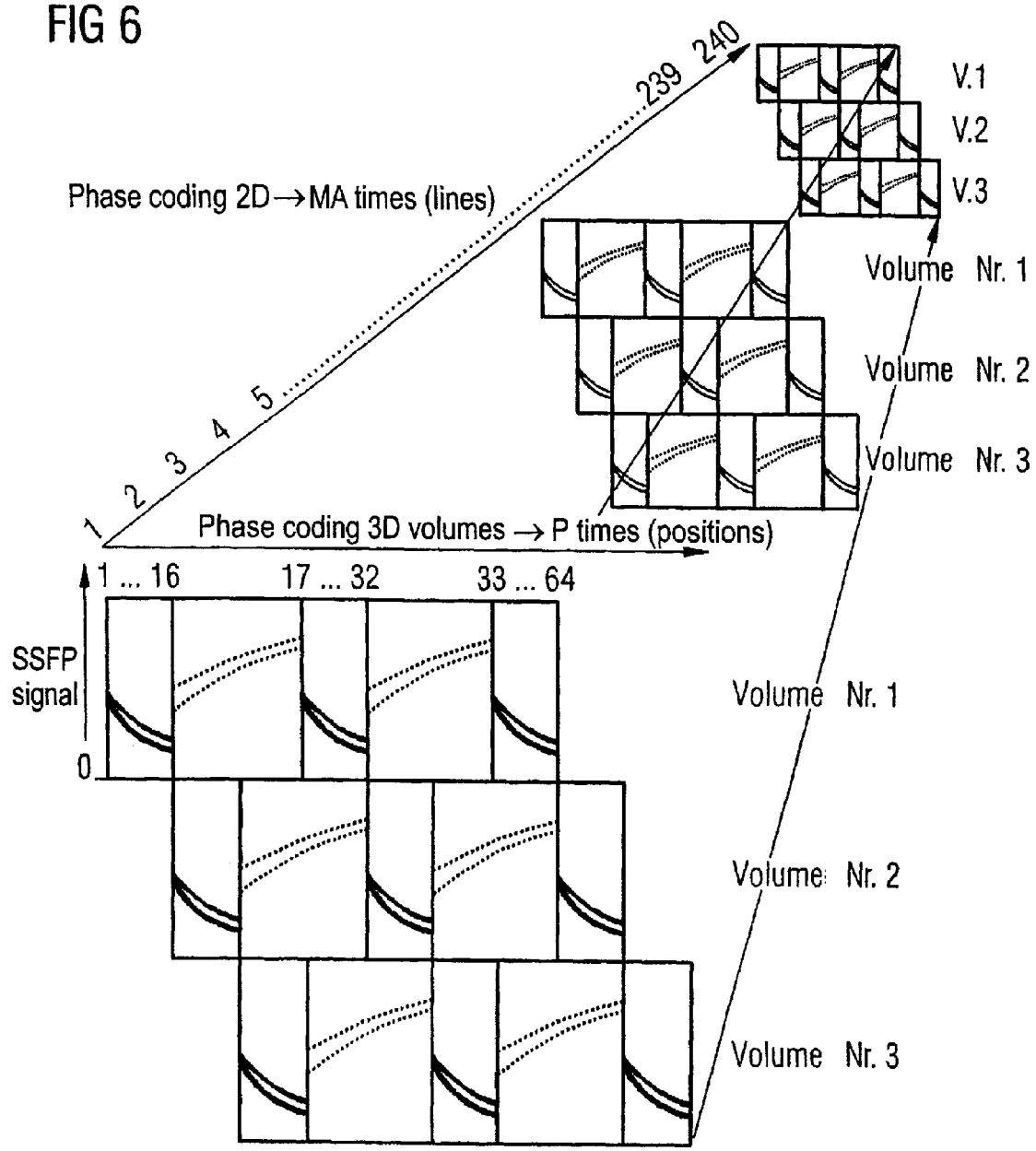

MAGNETIC RESONANCE IMAGING METHOD AND APPARATUS WITH APPLICATION OF THE TRUEFISP SEQUENCE AND SEQUENTIAL ACQUISITION OF THE MR IMAGES OF MULTIPLE SLICES OF A MEASUREMENT SUBJECT

BACKGROUND OF THE INVENTION

1. Field of the Invention

The present invention concerns a magnetic resonance imaging method based on the application of the TrueFISP sequence and the simultaneous acquisition of multiple parallel slices of a measurement subject. The invention also concerns a magnetic resonance tomography apparatus for implementation of such a method.

2. Description of the Prior Art

Magnetic resonance tomography (MRT) is an imaging modality with great importance for medical diagnostics. The continuous development of new or optimized pulse sequences significantly contributes to the success of MRT. Such new development is primarily intended to shorten the measurement time and/or to attain a higher contrast and/or a better signal/noise ratio (SNR).

Spin echo sequences were initially developed that partially exhibit the disadvantage of relatively long measurement times. Short measurement times can be obtained with gradient echo sequences. The FLASH sequence ("Fast Low Angle Shot") represents the classical gradient echo sequence but exhibits the disadvantage that the coherent transverse magnetization is destroyed with a spoiler pulse after the signal detection. In the TrueFISP sequence ("Fast Imaging with Steady State Precession"), which is also designated as the b-SSFP sequence ("balanced Steady State Free Precession"), the coherent magnetization is not destroyed. Instead, a rephasing of the transverse magnetization is implemented after the radio-frequency excitation of a slice and the signal detection, allowing high signal intensities to be achieved. The TrueFISP sequence on which the present invention is based was first described by Oppelt et al. (Oppelt, A.; Graumann, R., Electromedica 54 (1), p. 15-18 (1986); U.S. Pat. No. 4,769, 603). For a comprehensive depiction of the TrueFISP sequence as it is applied in the present invention, the article by Scheffler K. et al. is referenced (Scheffler K.; Lehnhardt S., Eur. Radiol. (2003) 13:2409-2418).

The inventive MR imaging method enables the measurement of a number of slices and representation under application of the 2D Fourier reconstruction methods and the measurement of a number of volumes and representation using the 3D Fourier reconstruction methods. In both cases the multi-slice technique essential to the invention is applied.

In the case of the 2D Fourier reconstruction, an individual data acquisition step of the TrueFISP sequence (i.e. the acquisition of the data for a phase coding line) can be divided into four time segments I through IV as is known in the art. In time segment I, the protons are excited with a radio-frequency pulse (RF pulse) at a flip angle $\alpha$, and the excitation ensues slice-selectively since a slice selection gradient $+G_S$ is activated temporally in parallel for excitation during a time span 2T. In time segment II, a slice selection gradient $-G_S$, a phase coding gradient $+G_P$ and a readout gradient $-G_R$ are activated. The (switching) activation of these three gradients ensues over a time span T. In the time segment III, a readout gradient $+G_R$ of the duration 2T is activated. During this activation, the magnetization is completely re-phased up to the point in time T at which the gradient echo is read out (i.e. the signal is detected). After the entire time interval 2T, the magnetization is de-phased again. In the time segment IV, a slice selection gradient $+G_S$, a phase coding gradient $-G_P$ and the readout gradient $-G_R$ that is essential for the TrueFISP sequence are respectively activated over a time span T. The data acquisition for a phase coding line ends at the end of the time segment IV. Due to the pulse sequence described above for the TrueFISP sequence, which proves to be highly symmetrical in the graphical representation (see Scheffler K. et al, as cited above [l.c.]), the magnetization after the time segment IV is completely re-phased, and the magnetization is altered somewhat as a consequence of a certain $T_1$ and $T_2$ relaxation. The next $\alpha$ RF excitation pulse is subsequently radiated for the data acquisition for the next phase coding line, with the algebraic sign of $\alpha$ being changed and the algebraic sign of the gradient remaining unchanged. The time span from one $\alpha$ RF pulse to the next $\alpha$ RF pulse corresponds to what is known as the repetition time TR and represents a TR interval. The above cycle is repeated MA times corresponding to the number MA of the phase coding lines of the raw data matrix. The total measurement of a slice by application of the TrueFISP sequence accordingly takes MA·TR.

In the case of data acquisition of volumes with 3D Fourier reconstruction, a phase coding gradient $G_{S,P}$ is additionally activated in the slice direction.

In the inventive method, the sequence of pulses, gradients and signal detection within a TR interval described above is used.

It can be shown that the highly-symmetrical pulse sequence and the re-phasing of the magnetization resulting therefrom lead to the adjustment of a dynamic equilibrium state of the magnetization after a larger number of TR intervals, this dynamic equilibrium state being designated as a "steady-state free precession" SSFP (see Scheffler K. et al., cited above). Before reaching this equilibrium state, the magnetization passes through a transient range in which the magnetization is significantly higher than in the equilibrium state. Since the magnetization in this time interval exhibits strong fluctuations, however, the transient range cannot be used for the data acquisition without further measures. The fluctuations disappear almost completely when an $\alpha/2$ RF excitation pulse (also designated as an $\alpha/2$ RF preparation pulse in the following) is radiated into the measurement subject with a time interval of TR/2 before the first $\alpha$ RF excitation pulse (Deimling, M.; Heid, O.; Society of Magnetic Resonance p. 495, 1994, Proceedings). Both the transient range and the subsequent dynamic equilibrium state then can be used for the data acquisition.

In the dynamic equilibrium state the TrueFISP sequence enables the highest possible SNR per time unit of all known sequences. However, it is problematic that the signal intensity in the dynamic equilibrium state is proportional to the quotient $T_2/T_1$ from the spin-spin relaxation constant ($T_2$) and the spin-grid relaxation constant ($T_1$). For data acquisition in the dynamic equilibrium state, the high signal intensity and the high SNR are achieved only for materials with similarly large $T_2$ and $T_1$. This applies to blood and cerebrospinal fluid (CSF). In contrast, tissues in which $T_1$ is typically significantly larger than $T_2$ are shown signal-poor. Examples of this are the white and grey brain matter, the liver tissue and the musculature. In contrast, in the transient range the signal intensity is more strongly proton density-weighted and barely dependent on the $T_2/T_1$ quotient, such that for this reason the transient range is also of interest for MR imaging with regard to the tissue shown signal-poor.

For application of the TrueFISP sequence with the typical linear phase coding, due to the $T_2/T_1$ weighting, MR images are acquired in which blood and CSF are mapped with high signal intensity and high SNR and the aforementioned tissues are mapped With low signal intensity and poor SNR. This result is not improved by the transient range for the data acquisition being made accessible by radiation of an $\alpha/2$ RF pulse because, given the linear phase coding, the data entries in the central k-space lines, that are important for the SNR and the contrast, are acquired only after filling half of the raw data matrix. At this point in time the excited slice has already reached the dynamic equilibrium state with its lower magnetization and the $T_2/T_1$ weighting of the signal intensity.

To solve this problem it has been proposed to implement the TrueFISP sequence with centrically-arranged phase coding and $\alpha/2$ RF preparation pulse. Centric phase coding means that initially the central lines of k-space and subsequently, successively the phase coding lines above and below these central lines are measured. The significantly earlier measurement of the central k-space lines actually leads to a distinct improvement of the SNR and of the contrast in the region of the aforementioned tissue. A disadvantage is that structures in the resulting MR image are shown blurred.

It is furthermore known to use the TrueFISP sequence with linear phase coding for the sequential measurement of a number of slices of a measurement subject. Sequential measurement means that the complete data acquisition is implemented for a slice before the next slice is measured. Since the workflow of the measurement for each individual slice hereby remains unchanged, the same problems exist as for the measurement of only one slice. This applies in the same manner when the sequential measurement of a number of slices is implemented using the centric phase coding. The problems occurring in connection with the measurement of only one slice also still exist.

SUMMARY OF THE INVENTION

An object of the present invention IS to provide a TrueFisp-based method for MR data acquisition that avoids the above problems of the prior art.

Starting from the described prior art, it is an object of the present invention to provide an MR imaging method based on the TrueFISP sequence and a magnetic resonance tomography apparatus for implementation of this method, with which method and apparatus a high signal/noise ratio SNR is achieved both for fluids and for tissue without the blurring of structures that occurs in centrically-arranged phase coding occurring.

This object is achieved in accordance with the present invention by a method for generation of magnetic resonance images based on the TrueFISP sequence with simultaneous acquisition of the MR images of a number of parallel slices of a measurement subject, which includes the following steps:
a) establishment of the number of the slices N to be acquired in the measurement subject, whereby N is at least 2,
b) establishment of the number of the phase coding lines MA per raw data matrix and slice N, with the requirement that the quotient of MA and N is a natural number,
c) establishment of the repetition time TR, the radio-frequency pulse duration RF and the flip angle $\alpha$,
d) sub-division of each raw data matrix into S separate segments to be measured, whereby S is equal to N or a whole-number multiple of N, with the requirement that the quotient Q of MA and S that corresponds to the number of the phase coding lines per segment is a natural number,
e) measurement of all segments S of all slices N, wherein the time duration (in msec) span $T_{Seg}$ for the acquisition of the data of each segment is $$T_{Seg} = TR + RF + \frac{MA}{S} \cdot TR,$$

and wherein the measurement of all segments S of all slices N is implemented such that the time duration (in msec) $T_{Relax}$ for the relaxation of the magnetization $M_Z$ with the relaxation constant $T_1$ in a slice N that corresponds to the time span from the end of the measurement of a first segment up to the beginning of the measurement of a second segment of the same slice is $$T_{Relax} = (N-1) \cdot T_{Seg}$$

Acquisition of the data of a segment, among other things involves the execution of the TrueFISP sequence described above, with the TR interval (formed by the sequence of excitation pulse, switched gradients and signal detection in the time intervals I through IV described above) is repeated Q times corresponding to the number Q of the phase coding lines per segment. An $\alpha/2$ RF preparation pulse is radiated before the first TR interval of each segment. After the last TR interval of each segment, with the exception of the last segment to be measured of each slice, an $\alpha/2$ attenuation pulse is additionally radiated. This additional $\alpha/2$ pulse, which is necessary for the regeneration (restoration) of the longitudinal magnetization $M_Z$, is described in detail in German Patentschrift DE 198 60 488 C1. Since, after the measurement of the last segment of each slice, no further data acquisition follows for this slice, in this case the $\alpha/2$ attenuation pulse is superfluous.

Measurement of all segments S of all slices N means the complete acquisition of all data, post-processing thereof, and storage thereof, in raw data matrices and the subsequent usage thereof for image reconstruction using the 2D Fourier method or the 3D Fourier method.

The measurement subject can be a human body.

The measurement of the segments S of all slices N is implemented in accordance with the invention such that (given N slices) initially a single segment is acquired in succession in each of these N slices, with the order for the acquisition of the data of all segments being established in these N slices, and such that this order is retained for the measurement (acquisition) of all further segments.

The acquisition of the data of each segment in accordance with the invention, individually includes the following steps in a typical manner:

radiation of an $\alpha/2$ preparation pulse, of Q $\alpha$ RF excitation pulses and of an $\alpha/2$ RF attenuation pulse in this order, with the algebraic sign of all pulses alternating between $+\alpha$ and $-\alpha$ and the interval between the $\alpha/2$ preparation pulse and the first $\alpha$ RF excitation pulse is TR/2 msec, the interval between the $\alpha$ RF excitation pulses is TR msec and the interval between the last $\alpha$ RF excitation pulse and the $\alpha/2$ attenuation pulse is TR/2 msec, activating of a slice selection gradient $+G_S$ upon radiation of the $\alpha/2$ preparation pulse and the $\alpha/2$ attenuation pulse and switching of the slice selection gradients $-G_S$, $+G_S$ and $-G_S$ before, during and after the radiation of the $\alpha$ RF excitation pulse, the phase coding gradients $+G_P$ and $-G_P$ and the readout gradients $-G_R$, $+G_R$ and $-G_R$ during the TR intervals, readout of the magnetic resonance signals radiated by the excited slice during an activated readout gradient $+G_R$ and storage of the measurement data in the raw data matrix.

Insofar as this sequence can be altered without the basis and effect of the TrueFISP sequence being changed, such alterations are encompassed within the inventive method. The inventive method can in particular be implemented under application of the sequence shown in FIG. 2.

At the end of the segmented data acquisition according to the inventive method, the acquired measurement data and measurement data stored in the raw data matrices can be processed in a typical manner under application of the 2D Fourier method or the 3D Fourier method or any other suitable method for MR image.

A notably higher SNR is obtained in the region of the tissue with very different $T_1$ and $T_2$ (such as white and grey brain matter, liver and musculature) with the inventive method than in the case of a TrueFISP measurement with sequential measurement of the same number of slices, in which inventive method: the number MA of the k-space lines (phase coding lines) established for a slice is sub-divided into a number of equally large segments that are measured individually; and in which a number of slices are simultaneously measured in a measurement procedure (multi-slice technique). The order of the measurement of all S segments of all slices is established, such that a relaxation time (in msec) $T_{Relax}$ for relaxation of the magnetization $M_Z$ in this slice (which relaxation time $T_{Relax}$ results from the following formula:

$$T_{Relax} = (N-1) \cdot T_{Seg}$$

is always provided between the measurement of a first segment and the measurement of a second segment of a slice. Given an approximately equal measurement duration, the SNR for this tissue (which is mapped only with poor signal in the prior art) increases by at least a factor of 2. Given application of the inventive method, the SNR of fluids (such as blood and CSF) remains at least as high as for the methods of the prior art. The interfering blurring of structures in the MR image that is seen in the case of the combination of the TrueFISP sequence with the centrically-arranged phase coding does not occur.

The inventive improvement of the SNR is based on the fact that, by the segmentation of k-space, a number of segments with a lower number of phase coding lines are formed that are measured within an excitation pulse train. The acquisition of all data of these shortened segments ensues completely at the high initial magnetization before the adjustment of the dynamic equilibrium state of the TrueFISP sequence. Since, after the end of the measurement of a segment in a first slice, at least one segment in at least one further slice is initially measured before the measurement of the next segment in the first slice is implemented, relaxation time $T_{relax}$ for the $T_1$ relaxation and with it the regeneration of the longitudinal magnetization are provided to the first slice. In the next RF excitation of this first slice, a similarly high or equally high magnetization as for the k-space lines of the first segment is thus provided for the k-space lines of the next segment.

With increasing slice count N, the time duration $T_{seg}$ required for the measurement of a segment always further decreases due to the decreasing number of k-space lines, such that the measurement is shifted ever more strongly at the start of the transient range. This has the advantage that an ever-larger portion of the k-space lines in the region of the highest initial magnetization is measured shortly after the radiation of the α/2 preparation pulse. Moreover, the shortening of the measurement duration has the advantage that the magnetization used for the data acquisition is always constant for all k-space lines.

A further advantage of the increasing slice count N and of the proportional increase of the number of the segments per slice that is connected with this is the prolonged relaxation time $T_{Relax}$ that follows the measurement of a segment for this slice, which leads to an increase of the initial magnetization at the beginning of the measurement of the next segment of this slice. This relaxation within an excited slice after the end of the data acquisition for a segment is represented by the following formula:

$$M_Z(T) = M_0 \cdot 1(1-\exp(-T/T_1)) + M_Z(0) \cdot \exp(-T/T_1)$$

By the utilization of the magnetization $M_Z$ at the point in time $T_{Seg}$ $$M_Z(0) = \sqrt{M_x^2(T_{Seg}) + M_y^2(T_{Seg})}$$

a high signal intensity is also ensured given the measurement of the next segment, such that overall a better SNR is achieved.

The total acquisition time for the measurement of all phase coding lines of all segments S of all slices N increases insignificantly relative to the sequential measurement of an equal number of slices according to the prior art because one additional α/2 preparation pulse and one additional α/2 attenuation pulse are radiated per segment, with the exception of the last segment of each slice.

The degree of the improvement of the SNR depends on the number of the measured slices. Up to approximately 30 slices are advantageously measured. The number of the slices advantageously lies in the range from 3 to 20. Given a smaller number of slices, the relaxation time $T_{Relax}$ decreases and the segment duration $T_{Seg}$ increases. The improvement of the SNR then turns out to be less. Given more than 20 slices one obtains only an insignificant increase of the relaxation time is obtained, while at the same time the number of the flanking α/2 RF pulses increases and the total measurement time for all slices is insignificantly extended. The relaxation time already reaches a very high value for N equals 10.

According to a first preferred embodiment, the number of the segments S per slice is equal to the number of the measured slices N. Alternatively, S can also be equal to 2N, 3N or 4N. The quotient from the number P of the phase coding lines of the raw data matrix and the number of the segments should also be a natural number. For the symmetrical variants, i.e. S equals N, the measurement time $T_{Seg}$ per segment and the subsequent relaxation time $T_{Relax}$ are each twice as long as for the variants in which S is equal to 2N. The advantage of the variants with S equaling N is that the relaxation time is longer and thus the magnetization can return to a higher value before the next measurement, so the amplitude of the SSFP signals is higher. The advantage of the variants with S equals 2N is that the measurement time $T_{Seg}$ is half as large, such that the magnetization decays less severely given the measurement of a segment and accordingly the amplitude of the SSFP signal during the data acquisition is somewhat more constant. The signal path excursion thus becomes smaller by this measure. The reduction of the signal excursion an also be achieved in the inventive method by the optimization of the flip angle distribution, i.e. by a continuous change of the flip angle from phase coding line to phase coding line or a change of the flip angle from phase coding line to phase coding line ensuing according to a different scheme.

According to a preferred embodiment, the inventive method is used for the measurement of volumes instead of slices. In this case a phase coding gradient $G_{S,P}$ is additionally switched in the slice direction P times, in that the measurement is repeated by the incrementing of a further phase coding table in order to fill up the data space in the image direction.

According to this embodiment N volumes are measured instead of N slices, for which a phase coding gradient in the slice direction is additionally incremented P times in an internal loop with the requirement that the quotient Q from P/N (which corresponds to the number of the phase coding steps per segment) is a natural number, and that the image phase coding is terminated in a further external loop by the incrementing occurring MA times.

The inventive method can accordingly be expanded by application of a typical 3D sequence by an additional external loop of MA increments across the in-plane Fourier lines (readout direction), with the inner loop of P increments passing over the Fourier lines in the slice direction.

The total measurement time TA for the 3D method results as the product of the number of increments P, the number of the volumes N, the lines MA and the repetition time TR:

$$TA = P \cdot N \cdot MA \cdot TR$$

Thus, also, $T_{Seg} = P \cdot TR$.

Furthermore, in the inventive method for measurement of volumes the loop order can initially be executed in the image direction MA and then in the slice increment direction P and thus be reversed.

According to the invention, the data acquisition for each segment can begin immediately after the radiation of the α/2 RF preparation pulse, i.e. already beginning with the radiation of the first α/2 RF excitation pulse. The largest initial magnetization of the transient range is thereby utilized for the measurement. Alternatively, the data acquisition can begin temporally offset: after the radiation of the α/2 RF preparation pulse a number of TR intervals are waited until the data acquisition is begun. In this manner possible fluctuations of the magnetization still present at the beginning of the excitation pulse train can be eliminated from the measurement.

According to a further preferred variant, for preparation of the magnetization a βRF pulse is radiated at an angle β in the range of 50 to 80° (advantageously 70°) for all segments before each α/2 RF preparation pulse and the remaining transverse magnetization is dephased with a gradient pulse. The setting of an equilibrium state of the magnetization is already promoted in the transient range. A nearly level curve of the magnetization can be achieved with this additional β RF pulse, with image artifacts (such as "ghosting") being reduced.

According to a preferred embodiment, a γ-pulse in the range $0° \leq \gamma \leq 180°$ is likewise additionally radiated for all segments before the beginning of the relaxation time $T_{relax}$ and the remaining transverse magnetization is dephased with a gradient pulse.

According to a further preferred embodiment, a segment or a number of segments or all segments with centric phase coding within this or these segments can be measured. For example, for a segment that includes the phase coding lines 81 through 160 this means that the phase coding line 120 is begun with given the measurement of this segment, after which the measurement ensues with the remaining k lines in the order 121, 119, 122, 118, 123, 117 etc.

The above object also is achieved in accordance with the present invention by a magnetic resonance tomography apparatus having a system computer that is programmed for execution of the method described above.

DESCRIPTION OF THE DRAWINGS

FIG. 5 is a diagram illustrating the connection between the number of the slices N and the relaxation time $T_{relax}$.

FIG. 6 schematically shows the implementation of the inventive method for the case of the measurement of volumes instead of slices.

DESCRIPTION OF THE PREFERRED EMBODIMENTS

Figure 1:
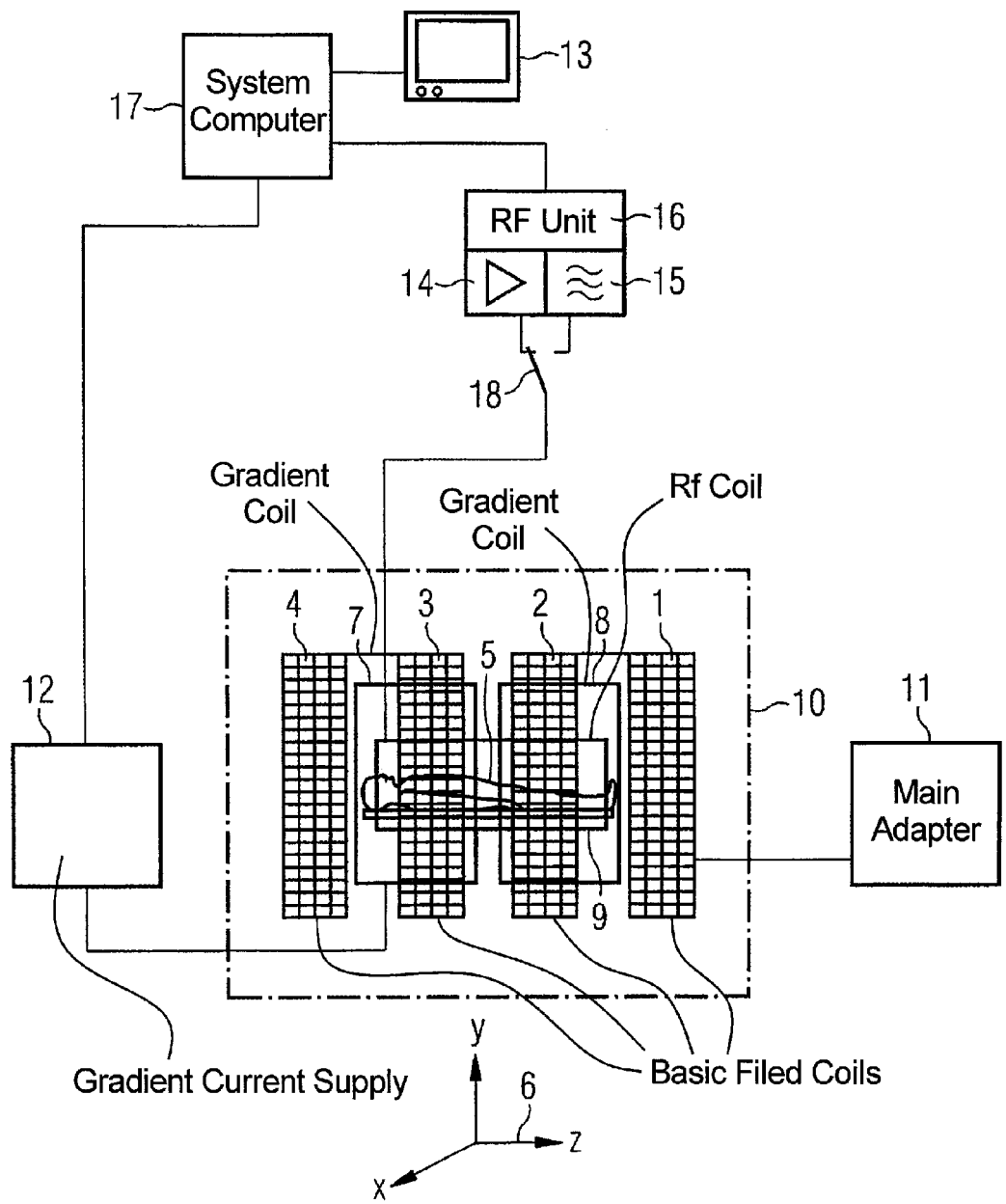
FIG. 1 shows the basic design of a nuclear magnetic resonance tomograph.

A typical magnetic resonance tomography apparatus for the generation of slice images of an examination subject is shown in FIG. 1, which also be used for the inventive method. It has coils (1, 2, 3, 4) that generate a magnetic basic field $B_0$. The measurement subject to be examined, for example the body of a patient, is located in this basic field. Moreover, the magnetic resonance tomography apparatus has gradient coils that serve for generation of independent magnetic field gradients perpendicular to one another in the directions x, y and z. For reasons of clarity, only the gradient coils 7 and 8 are drawn in FIG. 1, which gradient coils 7 and 8 serve for generation of the gradients $G_R$ together with a pair of oppositely-situated similar gradient coils. The similar gradient coils (not drawn) for $G_P$ lie parallel to the body 5 as well as above and below the body. The coils necessary for the gradient field $G_S$ are arranged transverse to the longitudinal axis of the body at the head end and the foot end. The apparatus furthermore has a radio-frequency coil 9 serving for generation of the RF radiation and for detection of the nuclear magnetic resonance signals. The coils 1, 2, 3, 4, 7, 8 and 9 circumscribed by a dash-dot line 10 represent the actual examination instrument. It is operated by an electrical arrangement that has a mains adapter 11 for operation of the coils 1 through 4 as well as a gradient current supply 12 with which are connected the gradient coils 7 and 8 as well as the further gradient coils. The gradient amplifier is operable with a rapidity that enables switching of the gradients with the speed required for the TrueFISP sequence. The measurement coil is coupled to a system computer 17 via a signal amplifier 14 or and a radio-frequency transmitter 15, to which system computer 17 is connected a monitor 18 for output of the MR images. The system computer is programmed for the implementation of the inventive method. The components 14 and 15 form a radio-frequency unit 16 for signal generation and signal detection. A change-over switch 18 enables the switching-over from transmission operation (mode) to reception operation (mode).

Figure 2:
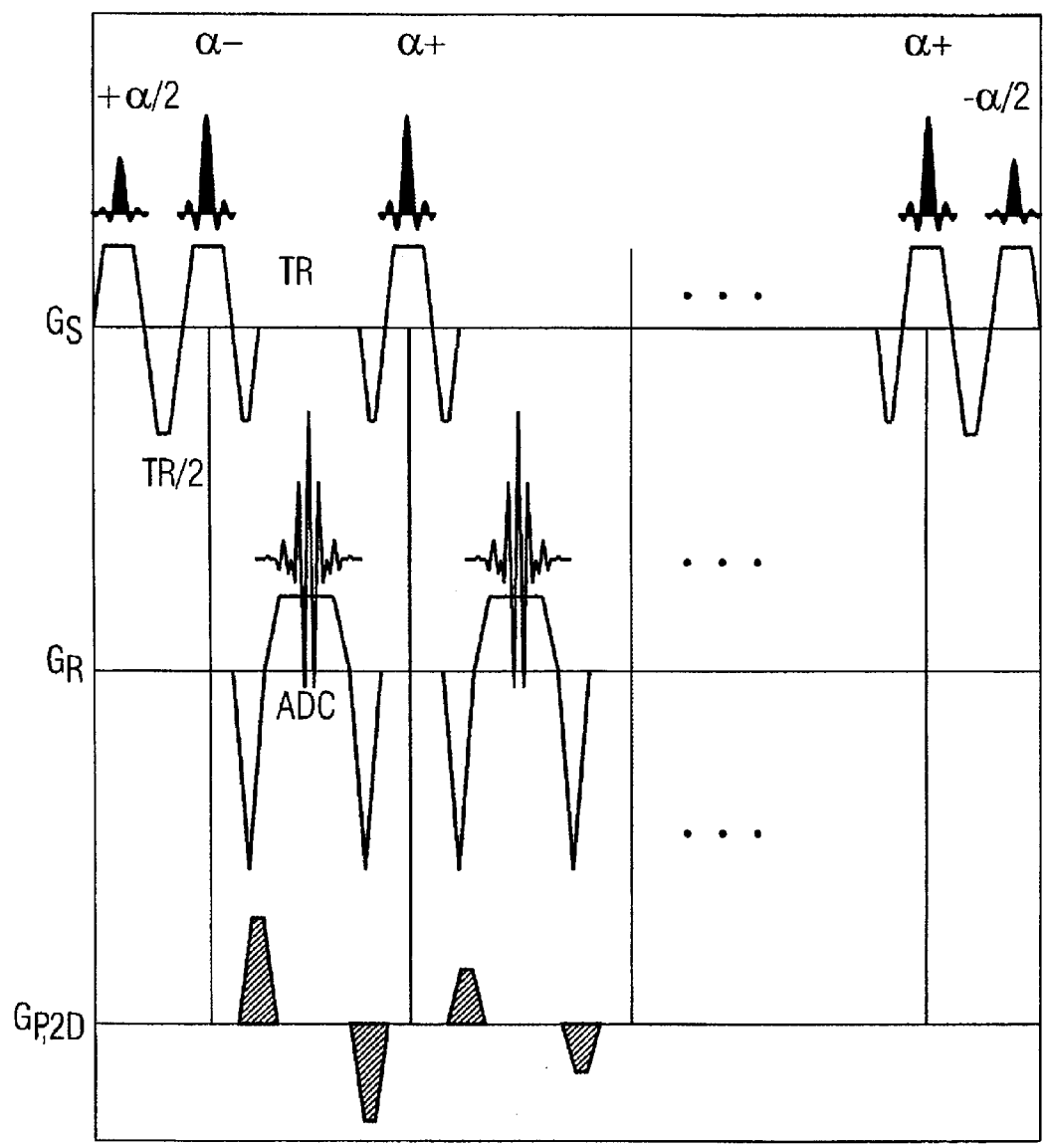
FIG. 2 shows the TrueFISP sequence that is executed for the acquisition of the data of a segment according to the inventive method.

FIG. 2 shows the pulse and gradient sequence of the preferably-used TrueFISP sequence. The measurement data acquired with this sequence are used for the imaging 2D or 3D Fourier reconstruction. The uppermost line shows the sequence of the RF pulses. The measurement of a segment begins with an α/2 RF preparation pulse which the α RF excitation pulses and an α/2 attenuation pulse concluding the segment follow. For simplification, only 2 of a total of Q α RF excitation pulses are shown. The time interval between the a pulses is TR msec; the time interval between α/2 pulses and α pulses is TR/2 msec. The flip angle α regularly changes its algebraic sign. The second line shows the slice selection gradients +$G_S$ (switched during the radiation of the of the α pulses and the α/2 pulses) that are respectively flanked by two gradients –$G_S$ that are half as intensively and switched half as long. The gradients $G_R$ and the signal detection are shown in the third line. The magnetic resonance signal is read out in the form of a gradient echo between two α RF excitation pulses after TR/2 msec (=echo time TE). During the detection of the magnetic resonance signal a readout gradient +$G_R$ for the spatial coding of the signal is switched that is flanked by two readout gradients –$G_R$ that are switched half as intensively and half as long. The advance readout gradient –$G_R$ dephases the magnetization while the subsequent readout gradient –$G_R$ effects the re-phasing of the magnetization. It arises from the fourth line that phase coding gradients +$G_P$ and –$G_P$ for the spatial coding of the detected signal are likewise switched simultaneously with the advance and the subsequent readout gradients –$G_R$. This highly-symmetrical sequence of gradients ensures that the magnetization is completely re-phased after the readout of a nuclear magnetic resonance signal and before the radiation of the next α RF excitation pulse.

Figure 3:
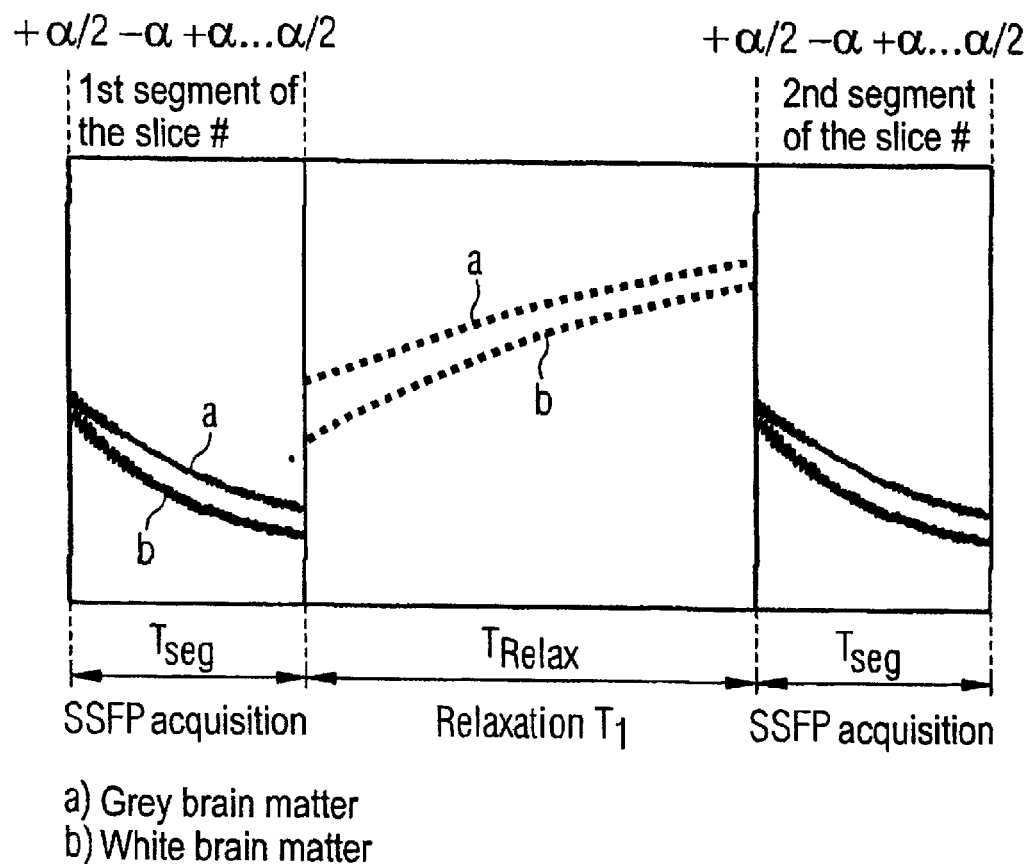
FIG. 3 shows a first segment and a second segment of the inventive method as well as the relaxation phase situated between them.

FIG. 3 shows the result of a simulation of the inventive method for two segments of a slice #. In practice, this corresponds to the implementation of the TrueFISP sequence that is shown in FIG. 2 for these two segments. The calculated SSFP signal intensities that are acquired for the phase coding lines that are associated with these two segments are plotted in the y-direction.

The two segments are separated from one another by a time duration $T_{Relax}$ that is twice as long, in which the magnetization relaxes without RF pulses and gradient fields with $T_1$ acting from the outside. The upper curve is a simulation for grey brain matter, the lower a simulation for white brain matter. The different results are based on the different proton densities and the different $T_1$ and $T_2$ relaxation times of white and grey brain matter.

The calculation simulates a measurement in the transient range, which can be detected in the steadily-decreasing signal intensity corresponding to a decreasing magnetization. Given implementation of the TrueFISP sequence, the SSFP signal intensity accordingly decreases faster for white brain matter during the excitation pulse train than for grey matter. Moreover, it can be seen that a faster relaxation of the magnetization is obtained in the relaxation phase for white brain matter than for grey brain matter.

Figure 4A:
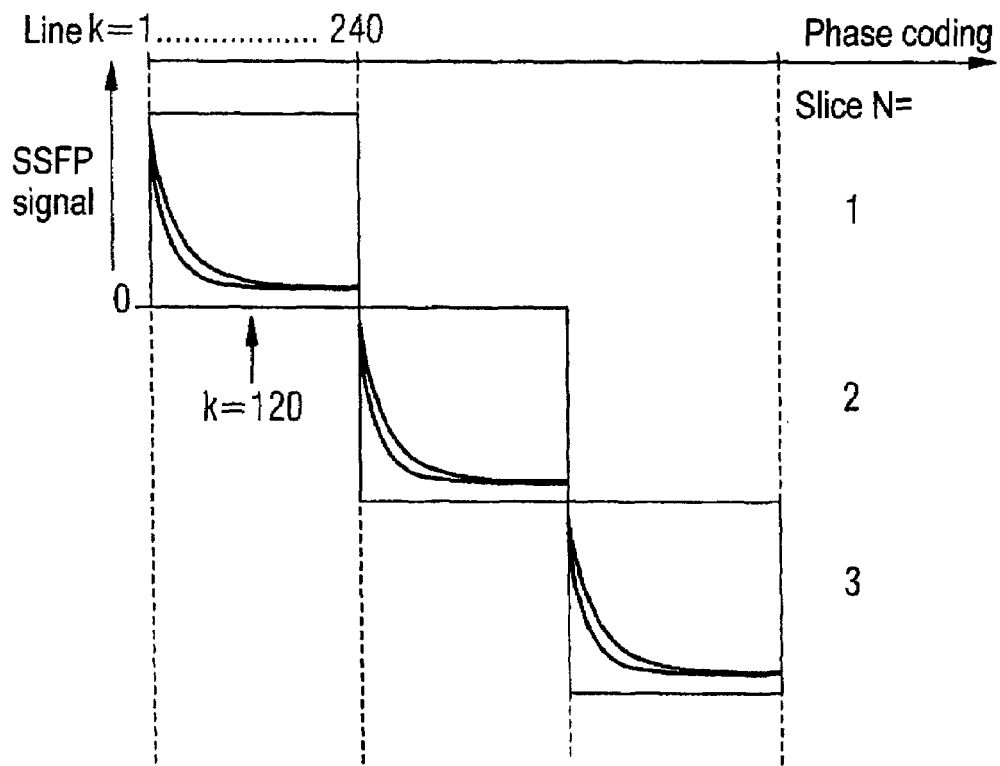
FIGS. 4A and 4B show a comparison of the closest prior art FIG. 4B with the inventive method (FIG. 4B).
Figure 4B:
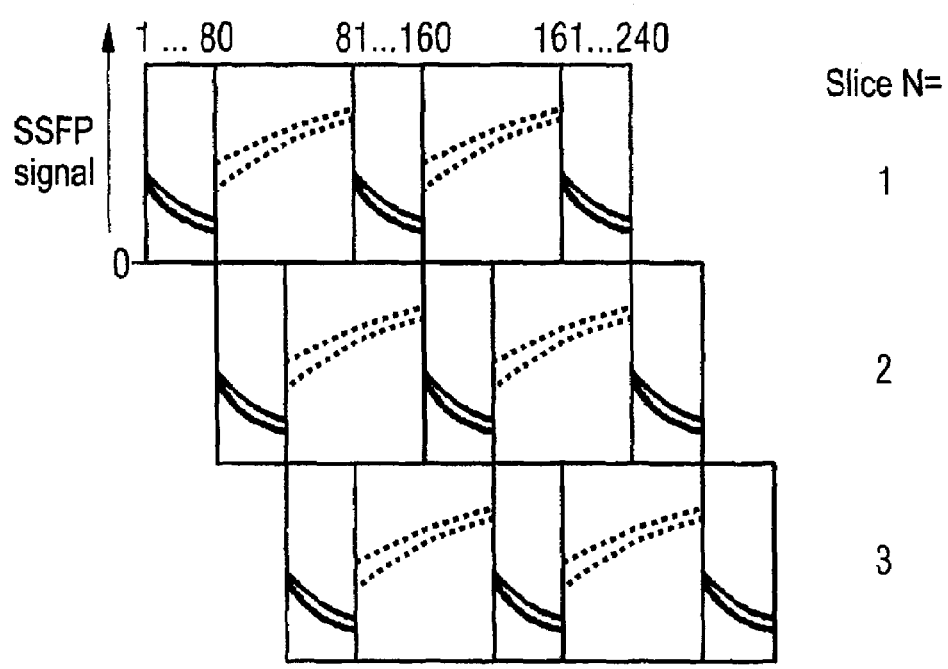

The results that are obtained given a simulation of the method of the nearest prior art and the inventive method are contrasted in FIGS. 4A and 4B. These simulations were also implemented for white brain matter and grey brain matter.

FIG. 4A represents the prior art and shows the simulation of a method with implementation of the TrueFISP sequence that is depicted in FIG. 2. Three slices (N=3) are sequentially measured in this method. A raw data matrix made up of 240 phase coding lines is applied for each of these slices and filled with calculated measurement data. 5 msec is provided for the repetition time TR, 70° is provided for the flip angle. The upper curve is obtained for grey brain matter (substance (1); proton density $M_{0(1)}$=1000, $T_{1(1)}$=1000 msec and $T_{2(1)}$=100 msec), the lower curve is obtained for white brain matter (substance (2); portion density $M_{0(2)}$=900, $T_{1(2)}$=700 msec and $T_{2(2)}$=70 msec).

In the sequential measurement of three slices, first all spatially-coded SSFP signals of the first slice, then of the second slice and finally of the third slice are detected and stored in three raw data matrices. According to expectation, the sum delivers the same result for all slices: the largest signal is calculated for k=1 (uppermost k-space line with strongest phase coding) while for k=120 (i.e. the central k-space line without phase coding) the signal intensity has already fallen to a low value which decreases slightly further for k=240 (strongest phase coding). This low value for k=120 is disadvantageous because the SNR and the contrast of the MR image are determined by the central k-space lines. The calculated SSFP signal of the central k-space line (k=120) of grey brain matter is 153 (in arbitrary units) and of white brain matter is 115.

FIG. 4B shows the simulation for the inventive method with segmentation of k-space for the measurement of likewise three slices under application of the sequence according to FIG. 2. The data used in the simulation coincide with the data used above. The axial scalings are identical, such that the results of the simulation can be directly compared with FIG. 4a). The raw data matrix comprising 240 k-space lines is sub-divided into three segments for all three slices, of which the first segment comprises the k-space lines 1 through 80, the second segment comprises the k-space lines 81 through 160 and the third segment comprises the k-space lines 161 through 240. Given disregard of the α/2 pulses, the acquisition time required in total coincides with the total acquisition time given the sequential method of the prior art according to FIG. 4a). The SSFP for the k-space lines 120 of the measurement of the middle segment of the third slice is drawn upon to determine the signal intensity of grey and white brain matter. A value of 314 (in arbitrary units) is obtained for the grey brain matter, a value of 258 is obtained for the white brain matter.

For the simulation of the measurement of three slices, the signal intensity is accordingly more than doubled due to the inventive sub-division of the k-space into 3 segments without a longer measurement time (that, in both cases, is 23600 msec) being required for this. The necessary number of the magnetization preparations with the duration: half radio-frequency pulse duration and half TR time: RF/2+TR/2=0.5+2.5=3 msec is equal to N given sequential multi-slice methods and equal to N·(2·N−1) given the segmented multi-slice method. Given a measurement instead of a simulation, the measurement time would thus be extended by 3·3=9 msec or, respectively, by 15·3=45 msec due to the required radiation of α/2 RF preparation pulses and α/2 RF attenuation pulses. This slight extension does not change that the SNR is improved by approximately a factor of 2 due to the inventive segmentation.

FIG. 4B additionally illustrates how the order in which the segments are measured is established according to the invention. The measurement of the 1st segment of the 2nd slice follows the measurement of the first segment of the 1st slice, and then the measurement of the 1st segment of the third slice follows. After measurement of a first segment for all 3 slices the measurement of all further segments is continued. From the first three measurements the order in which the 3 slices are excited is established at 1→2→3 given the further data acquisition with α RF pulses for measurement of the further segments. This order of the measurement of the S segments applies in a corresponding manner for methods with N slices. It is hereby ensured that the same relaxation time $T_{Relax}$ (dependent on N, MA and TR) is always available between two segments of a slice.

It is noted that the simulation of MR measurements enables a complete prediction of the results that are acquired when a real measurement is conducted.

The diagram according to FIG. 5 graphically represents the functional connection between the number of the measured slices N, the segmentation of k-space connected with this and the increase of the relaxation time $T_{Relax}$ following from this. The following connection exists between the duration of a segment and the intervening relaxation time for N slices and N segments. With the flanking preparation phases of the True-FISP sequence, the time per segment is $$T_{Seg} = 2 \cdot \left(\frac{RF}{2} + \frac{TR}{2}\right) + \frac{MA}{N} \cdot TR$$

The relaxation time is then $$T_{Relax} = (N-1) \cdot T_{Seg}$$

For a small segment number N, the relaxation time is greater out of proportion with N; given an increased number N, it only increases linearly with N. As of a specific number of slices N, a further increase of the slice count accordingly leads only to a very slight extension of the relaxation time $T_{Relax}$. However, since the measurement of a further segment is connected with each further slice and a flanking α/2 RF pulse extending the measurement time is required before and after the TrueFISP sequence for each segment, the efficiency of the inventive method insignificantly decreases as of a specific slice number due to the extended measurement duration. According to FIG. 5, an optimal slice count N lies, for instance, at N equals 3 to 18, for example at 10.

FIG. 6 shows the application of the inventive method for the measurement of volumes instead of slices. The described multi-slice TrueFISP 2D scheme is expanded here by one dimension into a 3D method in that a further data acquisition loop is added. Instead of exciting N slices, N volumes are excited whose segments are respectively phase coded P times in succession in the slice direction. After this coding in the slice direction (partition direction) is concluded, this procedure is repeated MA times with respective incrementing of the phase coding gradients in the direction perpendicular to this. the total measurement time TA for the 3D method is $TA_{3D}$=partitions P* volumes N* lines MA* repetition time TR=230 s when one assumes P=64, N=3, MA=40 and TR=5 ms. For comparison, the total measurement time TA for the 2D method $TA_{2D}$=slices N* lines MA* repetition time TR=3.6 s.

Although modifications and changes may be suggested by those skilled in the art, it is the intention of the inventor to embody within the patent warranted hereon all changes and modifications as reasonably and properly come within the scope of his contribution to the art.

I claim as my invention:

1. Method for generation of magnetic resonance images based on a TrueFISP sequence with simultaneous acquisition of the MR images of a plurality of parallel slices of a measurement subject with raw data for the respective slices being entered into a respective raw data matrices, comprising the steps of:
   a) establishing a number of the slices N to be acquired in a measurement subject, wherein N is at least 2;
   b) establishing a number of phase coding lines MA per raw data matrix per slice, with a requirement that a quotient of MA and N is a natural number;
   c) establishing a repetition time TR, a radio-frequency pulse duration RF and a flip angle α for acquiring said slices;
   d) sub-dividing each raw data matrix into S separate segments to be measured, wherein S is equal to N or a whole-number multiple of N, with a requirement that a quotient Q of MA and S, that corresponds to a number of the phase coding lines per segment, is a natural number;
   e) acquiring data for all segments S of all slices N, with the time duration, in msec, $T_{Seg}$ for the acquisition of the data of each segment being $$T_{Seg} = TR + RF + \frac{MA}{S} \cdot TR$$

and wherein the acquisition of said data for all segments S of all slices N is implemented with a time duration, in msec, $$T_{Relax} = (N-1) \cdot T_{Seg}$$

for relaxation of the magnetization $M_z$ with a relaxation constant $T_1$ in a slice N that corresponds to a time duration from an end of a measurement of a first segment up to a beginning of a measurement of a second segment of the same slice, thereby obtaining a plurality of raw data matrices filled with raw data respectively for said N slices; and
   (f) processing each of said raw data matrices by multi-dimensionally Fourier transforming the raw data thereof to obtain image data for each of said slices in a form suitable for visual display, and making said image data available as an output.

2. A method as claimed in claim 1, comprising acquiring said data for the segments S of all slices N by initially acquiring data for a single segment in succession in each of these N slices, with an order for the acquisition of the data of all segments being established in said N slices, retaining said order for data acquisition for all further segments.

3. A method as claimed in claim 1 comprising acquiring the data for each segment by the steps of:
   radiating, in sequence, an α/2 preparation pulse, of Q αRF excitation pulses and of an α/2 RF attenuation pulse, with the respective algebraic sign of all pulses alternates between +α and −α and an interval between the α/2 preparation pulse and the first α RF excitation pulse being TR/2 msec, an interval between the α RF excitation pulses being TR msec and an interval between a last α RF excitation pulse and the α/2 attenuation pulse being TR/2 msec,
   activating a slice selection gradient +$G_s$ upon radiation of the α/2 preparation pulse and the α/2 attenuation pulse and switching the slice selection gradients −$G_s$, +$G_s$ and −$G_s$ before, during and after the radiation of the α RF excitation pulse, and switching the phase coding gradients +$G_P$ and −$G_P$ and the readout gradients −$G_R$, +$G_R$ and −$G_R$ during the TR intervals,
   reading out magnetic resonance signals radiated by the excited slice with an activated readout gradient +$G_R$ and storing of the data in the raw data matrix.

4. A method as claimed in claim 3 comprising, for each segment beginning data acquisition only after radiation of the α/2 RF preparation pulse and a plurality of a RE excitation pulses.

5. A method as claimed in claim 3, comprising radiating a β RF pulse with an angle β in a range between 50° and 80° for preparation of the magnetization before all α/2 RF magnetization pulses, and dephasing remaining transverse magnetization with a gradient pulse.

6. A method as claimed in claim 3 comprising radiating a γ-pulse in a range 0°≦γ≦180° in all segments for which data are to be acquired after the α/2 RF attenuation pulse and before a beginning of the relaxation time $T_{relax}$, and dephasing remaining transverse magnetization is dephased with a gradient pulse.

7. A method as claimed in claim 1 comprising, for each segment, immediately beginning data acquisition upon radiation of a first α RF excitation pulse after the radiation of α/2 RF preparation pulse.

8. A method as claimed in claim 1, wherein S=N.

9. Method for generation of magnetic resonance images based on a TrueFISP sequence with simultaneous acquisition of the MR images of a plurality of volumes of a measurement subject with raw data for the respective volumes being entered into a respective raw data matrices, comprising the steps of:
   a) establishing a number of the volumes N to be acquired in a measurement subject, wherein N is at least 2;
   b) establishing a number of phase coding lines MA per raw data matrix per volume, with a requirement that a quotient of MA and N is a natural number;
   c) establishing a repetition time TR, a radio-frequency pulse duration RF and a flip angle α for acquiring said volumes;
   d) sub-dividing each raw data matrix into S separate segments to be measured, wherein S is equal to N or a whole-number multiple of N, with a requirement that a quotient Q of MA and S, that corresponds to a number of the phase coding lines per segment, is a natural number;
   e) acquiring data for all segments S of all volumes N, with the time duration, in msec, $T_{Seg}$ for the acquisition of the data of each segment being $T_{Seg} = P \cdot TR$ and wherein the acquisition of said data for all segments D of all volumes N is implemented with a time duration, in msec, $T_{Relax} = (N-1) \cdot T_{Seg}$ for relaxation of the magnetization $M_z$ with a relaxation constant T1 in a volume N that corresponds to a time duration from an end of a measurement of a first segment up to a beginning of a measurement of a second segment of the same volume, and incrementing a phase coding gradient P times in an internal loop with a requirement that a quotient P/N, corresponding to a number of phase coding steps per segment, is a natural number, and terminating said phase coding in a further external loop after MA increments in said further external loop, thereby obtaining a plurality of raw data matrices filled with raw data respectively for said N volume; and
   (f) processing each of said raw data matrices by multi-dimensionally Fourier transforming the raw data thereof to obtain image data for each of said volumes in a form suitable for visual display, and making said image data available as an output.

10. A method as claimed in claim 9 comprising executing said external loop in an opposite direction from said internal loop.

11. A magnetic resonance tomography apparatus comprising:
   a magnetic resonance scanner adapted to interact with an examination subject to acquire data therefrom; and
   a control unit connected to said magnetic resonance scanner that operates said magnetic resonance scanner to acquire said data based on a TrueFISP sequence with simultaneous acquisition of MR images of a plurality of parallel slices of the examination subject, by establishing a number of the slices N to be acquired in a measurement subject, wherein N is at least 2, establishing a number of phase coding lines MA per raw data matrix per slice, with a requirement that a quotient of MA and N is a natural number, establishing a repetition time TR, a radio-frequency pulse duration RF and a flip angle α for acquiring said slices, sub-dividing each raw data matrix into S separate segments to be measured, wherein S is equal to N or a whole-number multiple of N, with a requirement that a quotient Q of MA and S, that corresponds to a number of the phase coding lines per segment, is a natural number acquiring data for all segments S of all slices N, with the time duration, in msec, $T_{Seg}$ for the acquisition of the data of each segment being $T_{Seg} = TR + RF + MA/S \cdot TR$ and wherein the acquisition of said data for S all segments S of all slices N is implemented with a time duration, in msec, $T_{Relax} = (N-1) \cdot T_{Seg}$ for relaxation of the magnetization $M_z$ with a relation, constant $T_1$ in a slice N that corresponds to a time duration from an end of a measurement of a first segment up to a beginning of a measurement of a second segment of the same slice.

12. A magnetic resonance tomography apparatus comprising:
   a magnetic resonance scanner adapted to interact with an examination subject to acquire data therefrom; and
   a control unit connected to said magnetic resonance scanner that operates said magnetic resonance scanner to acquire said data based on a TrueFISP sequence with simultaneous acquisition of MR images of a plurality of parallel slices of the examination subject, by establishing a number of the volumes N to be acquired in a measurement subject, wherein N is at least 2, establishing a number of phase coding lines MA per raw data matrix per volume, with a requirement that a quotient of MA and N is a natural number, establishing a repetition time TR, a radio-frequency pulse duration RF and a flip angle α for acquiring said volumes, sub-dividing each raw data matrix into S separate segments to be measured, wherein S is equal to N or a whole-number multiple of N, with a requirement that a quotient Q of MA and S, that corresponds to a number of the phase coding lines per segment, is a natural number acquiring data for all segments S of all volumes N, with the time duration, in msec, $T_{Seg}$ for the acquisition of the data of each segment being $T_{Seg} = P \cdot TR$ and wherein the acquisition of said data for all segments S of all volumes N is implemented with a time duration, in msec, $T_{Relax} = (N-1) \cdot T_{Seg}$ for relaxation of the magnetization Mz with a relaxation constant $T_1$ in a volume N that corresponds to a time duration from an end of a measurement of a first segment up to a beginning of a measurement of a second segment of the same volume, and incrementing a phase coding gradient P times in an internal loop with a requirement that a quotient P/N, corresponding to a number of phase coding steps per segment, is a natural number, and terminating said phase coding in a further external loop after MA increments in said further external loop, thereby obtaining a plurality of raw data matrices filled with raw data respectively for said N volume, and processing each of said raw data matrices by multi-dimensionally Fourier transforming the raw data thereof to obtain image data for each of said volumes in a form suitable for visual display, and making said image data available as an output.

* * * * *